United States Patent
Warwick

(10) Patent No.: US 10,079,202 B2
(45) Date of Patent: Sep. 18, 2018

(54) STRUCTURE FOR ISOLATING HIGH SPEED DIGITAL SIGNALS IN A HIGH DENSITY GRID ARRAY

(71) Applicant: Thomas P Warwick, Melbourne, FL (US)

(72) Inventor: Thomas P Warwick, Melbourne, FL (US)

(73) Assignee: R&D Circuits, Inc., South Plainfield, NJ (US)

( * ) Notice: Subject to any disclaimer, the term of this patent is extended or adjusted under 35 U.S.C. 154(b) by 0 days.

(21) Appl. No.: 14/721,263

(22) Filed: May 26, 2015

(65) Prior Publication Data
US 2015/0348901 A1 Dec. 3, 2015

Related U.S. Application Data

(60) Provisional application No. 62/003,116, filed on May 27, 2014.

(51) Int. Cl.
*H05K 1/11* (2006.01)
*H01L 23/522* (2006.01)
(Continued)

(52) U.S. Cl.
CPC .... *H01L 23/5225* (2013.01); *H01L 21/76843* (2013.01); *H01L 23/5226* (2013.01);
(Continued)

(58) Field of Classification Search
CPC ... H05K 1/02; H05K 1/11; H05K 1/18; H05K 1/24; H05K 1/222; H05K 1/251; H05K 3/00; H01R 12/51
(Continued)

(56) References Cited

U.S. PATENT DOCUMENTS 6,392,160 B1 * 5/2002 Andry ............... H05K 1/0222
174/261
2013/0098671 A1 * 4/2013 Thurairajaratnam .. H05K 1/024
174/266
(Continued)

*Primary Examiner* — Xiaoliang Chen
(74) *Attorney, Agent, or Firm* — Richard B Klar, Esq.; Law Office of Richard B. Klar

(57) ABSTRACT

Due to size and cost, it becomes advantageous for integrated circuit (IC) manufacturers to use "single-ended" (one signal path per unique information path) high speed signals electrical contact pins (pins transmitting digital information that connect the integrated circuit to a printed circuit board) with a minimum number of surrounding powers and grounds. This lower cost method, however, creates electrical interference and coupling issues known as crosstalk between two adjacent signal paths in the via structure required to electrically connect the integrated circuit to the signal paths in the printed circuit board. Such crosstalk, in turn, increases jitter, degrades timing, and ultimately reduces the maximum operating speed of the circuit (performance). This disclosure presents a structure using micro-plating, micro-drilling and micro-machining methods that isolates adjacent signals by placing a metal barrier that shunts coupling currents to ground. The micro-drilling methods also reduce the length of adjacent signal paths in a specific signal routing and controlled depth drilling sequence.

21 Claims, 22 Drawing Sheets

(51) Int. Cl.
*H01L 21/768* (2006.01)
*H01L 23/528* (2006.01)
*H01L 23/552* (2006.01)
*H05K 1/02* (2006.01)

(52) U.S. Cl.
CPC ........ *H01L 23/5286* (2013.01); *H01L 23/552* (2013.01); *H05K 1/0222* (2013.01); *H05K 1/116* (2013.01); *H01L 2224/16225* (2013.01); *H05K 1/0243* (2013.01); *H05K 1/113* (2013.01); *H05K 2201/0723* (2013.01); *H05K 2201/09227* (2013.01); *H05K 2201/09618* (2013.01); *H05K 2201/09809* (2013.01); *H05K 2201/10674* (2013.01); *H05K 2203/0207* (2013.01)

(58) Field of Classification Search
USPC ...... 361/816; 174/260, 261, 266; 439/63, 65
See application file for complete search history.

(56) References Cited

U.S. PATENT DOCUMENTS

| 2013/0112465 | A1* | 5/2013 | Duvanenko | H05K 1/0216 174/260 |
| 2013/0330941 | A1* | 12/2013 | Jeon | H01R 12/585 439/65 |
| 2013/0342280 | A1* | 12/2013 | Blanton | H01P 5/02 333/33 |

* cited by examiner

FIG. 1: Isolation Improvement vs. Frequency of Disclosed Structures

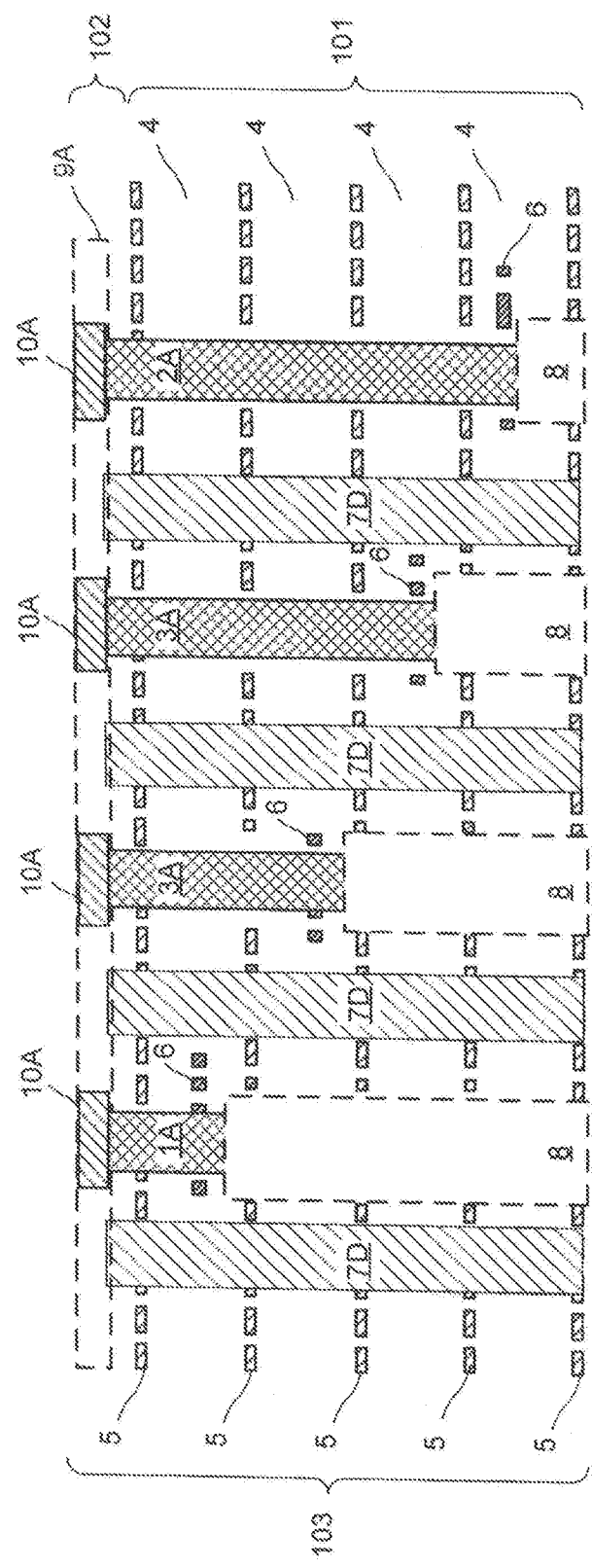
F I G. 21

STRUCTURE FOR ISOLATING HIGH SPEED DIGITAL SIGNALS IN A HIGH DENSITY GRID ARRAY

BACKGROUND

1. Field

This present invention is for a structure within a printed circuit board that is used for the purposes of mitigating electrical coupling (crosstalk) between two adjacent high speed signals. In particular the present invention relates to a structure implemented in a printed circuit board, in a printed circuit board sub-lamination, or in a like coplanar structure that mitigates cross-coupling of adjacent, unique signals, as defined by an integrated circuit grid array

2. The Related Art

Crosstalk issues are addressed by the prior art in one of two ways. Method one uses differential signals (two signal paths) for each unique information path. A differential signal escape with tight electrical coupling natively provides good isolation. Method two surrounds each electrical signal escaping the integrated circuit with a return current path (additional pin), such as electrical ground or electrical power. This isolation pin on the integrated circuit shunts electro-magnetic energy away from adjacent pins.

While the aforementioned prior art methods both work extremely well they require a high manufacturing cost. Differential signals require two different signal paths and integrated circuit pins for each unique information path. Likewise in the second method, which provides a shunt path for electro-magnetic energy, a ground or power pin must be adjacent to every unique signal path/pin. In both prior art cases, the structures result in a significantly larger integrated circuit package. This drives cost. It would be desirable to provide a technology that provides for good high speed isolation in the printed circuit board which allows the integrated circuit manufacturer to sell their product more competitively without compromising performance.

SUMMARY

This present invention describes a structure implemented in a printed circuit board, in a printed circuit board sub-lamination, or in a like coplanar structure that mitigates cross-coupling of adjacent, unique signals, as defined by an integrated circuit grid array. The structure has three main components: (1) A micro-machined and plated isolation barrier connected to a supply voltage or ground, (2) Controlled depth drill removal of vias extending past the escape layers arranged in a sequenced pattern in the printed circuit board sub-lamination (or booklet) stack-up to prevent metal layer trace damage, and (3) A fine-pitch metal layer trace escape method that assists with impedance control.

BRIEF DESCRIPTION OF DRAWINGS

FIGS. 3-5 show a sectional top-view showing the breakout of the remaining via rows requiring isolation and the presence of the controlled depth drill and its proximity to isolation barriers

FIG. 2 is a sectional view of the embodiment of FIG. 7 and FIG. 8;

FIGS. 9-13 describe a first method for structure 1 with a nickel sintering paste mix or nickel plate in which:

FIG. 10 is a sectional side view of a second step of the isolation structure of embodiment of FIG. 2 of the present invention showing the isolation barrier separating the escape vias;

FIG. 11 is a sectional side views of a alternative embodiment for creating the isolation barrier for FIG. 2 of the present invention wherein instead of metal plated vias forming the isolation barriers a cavities are created with electroless copper plate and pressed in conductive sintering paste mixed with nickel micro-particles, ultra-thin electroless plate followed by electrolytic nickel plating;

FIG. 12 shows a sectional side view of an additional step for the embodiment of the present invention as shown in FIG. 9 for removing excess metal from escape vias;

FIG. 13 is a sectional side view of the embodiment of the present invention in FIG. 1 showing the completed printed circuit board;

FIGS. 14-16 illustrates the second method of the present invention for structure 1 utilizing a simple copper plate in which FIG. 14 is step 1 of method 1 of the present invention in which a conductive Isolation Barrier is created;

FIG. 15 is step 2 of method 1 of FIG. 14 in which excess metal stubs are removed from escape vias by a controlled depth drill process;

FIG. 16 is step 3 of method 1 of FIG. 14 illustrating the completed printed circuit board;

FIGS. 18-22 illustrate a third method for the present invention in which:

FIG. 18 shows a third method, first step for the present invention in which a conductive isolation barrier is created in the same process steps as was the escape vias of the embodiment in FIGS. 10-14;

FIG. 19 is the second step of method 3 of FIG. 18 showing the selective plating of the escape vias;

FIG. 20 illustrates step 3 of method 3 of the present invention of FIG. 18 in which there is an etching of the top metal, finish plate, and the void is filled with a liquid dielectric referred to as a "flush circuit";

FIG. 21 illustrates step 4 of method 3 of the present invention showing control depth drill escape vias and removal of excess metal; and FIG. 22 illustrates Structure 2 in mission mode for method 3 of the present invention.

DETAILED DESCRIPTION OF THE PREFERRED EMBODIMENTS

Figure 1:
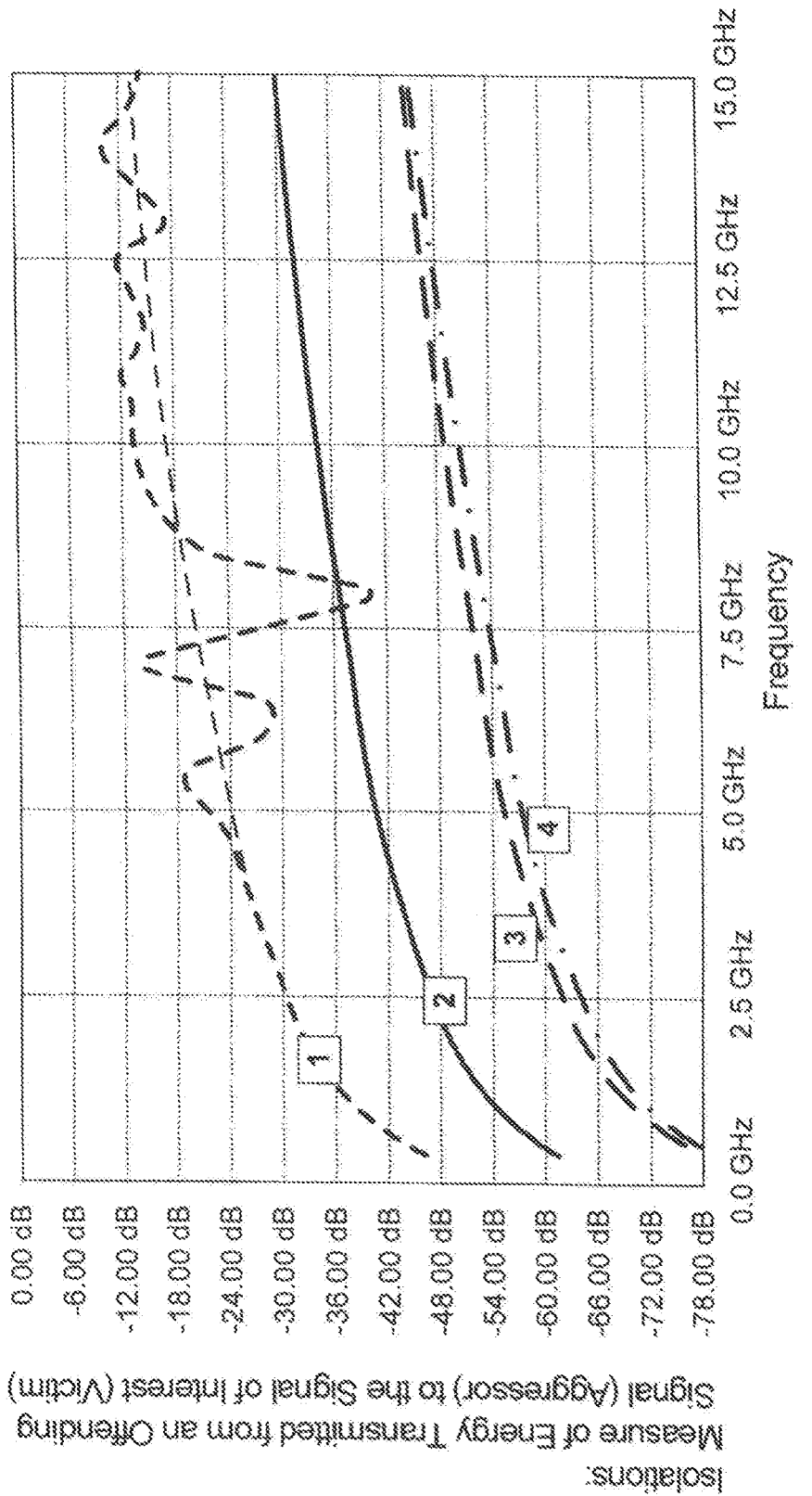
FIG. 1 is a graph showing isolation improvement as a function of frequency for disclosed structures in accordance with the teachings of the present invention.

The present invention provides for three methods for isolating high speed digital signals in a high density grid array that utilize any one of a variety of isolation barrier shapes (element number 7) including round hole, c-shape, and straight line wall structures illustrated below respectively as element numbers 7a and 7b and 7c. Each of the isolation barriers 7, 7a, 7b, 7c and 7d can be used in two primary structures for any of the three methods. These two primary structures differ in how the isolation barrier is insulated from the integrated circuit device. The term mission mode in the present application refers to how the present invention operates when the integrated circuit device (IC) is connected.

FIGS. 9-13 describe the first method for structure 1 with a nickel sintering paste mix or nickel plate. The element numbers for this embodiment are:
1. Inner-most Integrated Circuit Device Escape via built into the sub-lamination
2. Outer-most Integrated Circuit Device Escape via built into the sub-lamination
3. Inner Integrated Circuit Device Escape via built into the sub-lamination
4. Non-conductive dielectric (e.g. printed circuit board) material
5. Conductive metal (e.g. copper) foil in a full plane configuration to provide ground plane coverage for escape traces. Planes are etched openings for clearance of non-ground escape vias.
6. Conductive metal traces (e.g. copper) for escaping the integrated circuit device and connecting it electrically to other devices
7. Conductive Isolation barrier electrically connected to ground planes [4]:
8. Controlled Depth drill to remove excess via metal (stubs), filled with non-conductive material or vacuum.
9. Very thin build-up layer of non-conductive dielectric material.
10. Micro-via and external connecting escape vias to the surface for integrated circuit device or socket attachment
11. (Optional) lower portion/bulk of the printed circuit board or attaching structure.

Figure 2:
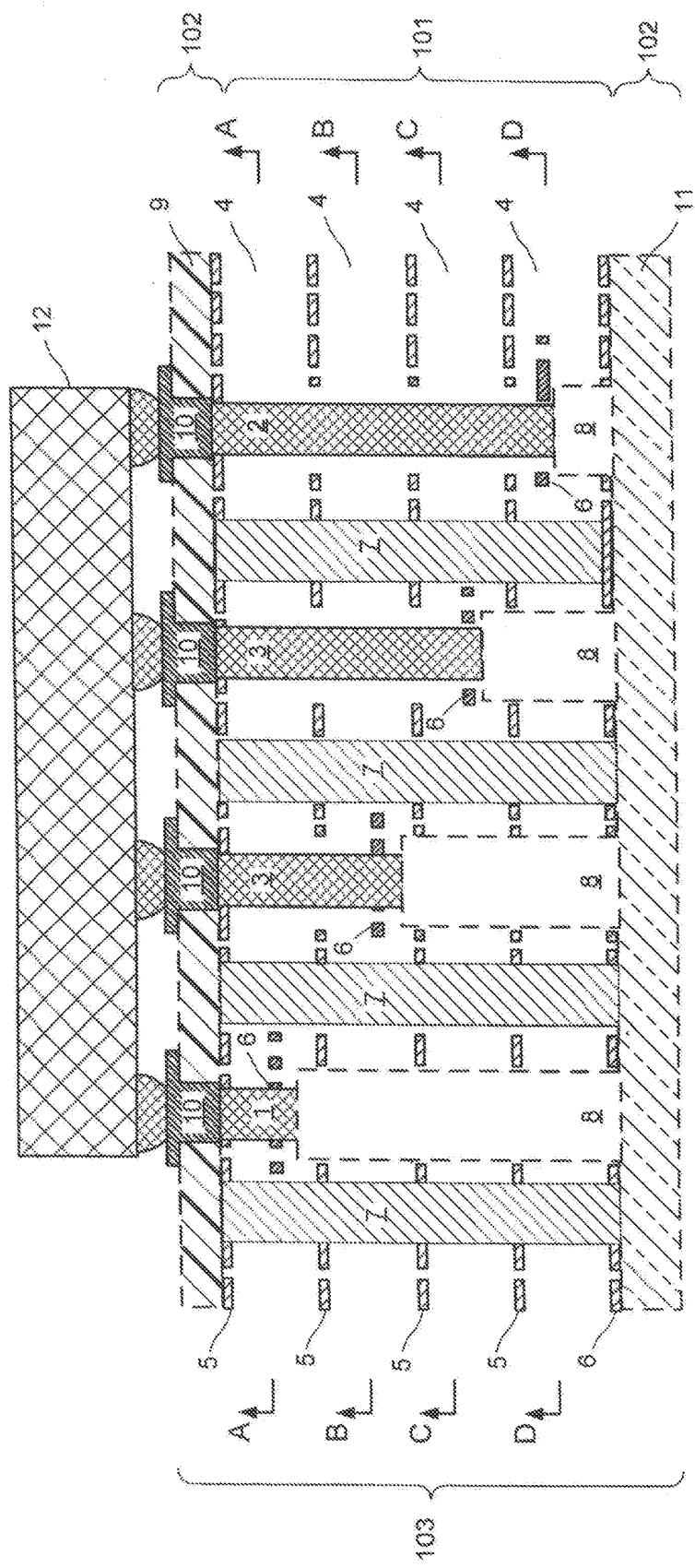
FIG. 2 is a sectional side view of a first embodiment of the present invention showing the completed printed circuit board with an attach mechanism to the integrated circuit device.

FIGS. 2-6 describes the first structure in mission mode for the methods 1 and 2:

FIG. 2 has element nos.:
1. Inner-most Integrated Circuit Device Escape via built into the sub-lamination
2. Outer-most Integrated Circuit Device Escape via built into the sub-lamination
3. Inner Integrated Circuit Device Escape via built into the sub-lamination
4. Non-conductive dielectric (e.g. printed circuit board) material
5. Conductive metal (e.g. copper) foil in a full plane configuration to provide ground plane coverage for escape traces. Planes are etched openings for clearance of non-ground escape vias.
6. Conductive metal traces (e.g. copper) for escaping the integrated circuit device and connecting it electrically to other devices. Conductive traces escape in a specific sequence in the printed circuit board stack-up from the inner-most vias escaping on layers at the "top" of the sub-lamination and the outer-most vias escaping at the "bottom" of the sub-lamination.
7. Conductive Isolation barrier electrically connected to ground planes [4]:
8. Controlled Depth drill to remove excess via metal (stubs), filled with non-conductive material or vacuum. The controlled depth drill creates a cross-sectional pattern analogous to a "stair-step" shape. This shape, when followed, works in conjunction with [6] to prevent trace damage during the manufacturing process.
9. Very thin build-up layer of non-conductive dielectric material.
10. Micro-via and external connecting escape vias to the surface for integrated circuit device or socket attachment
11. (Optional) lower portion/bulk of the printed circuit board or attaching structure.
12. Integrated Circuit device: solder reflow attached or socketed. This attach mechanism is peripheral to this embodiment of the present invention.

Figure 3:
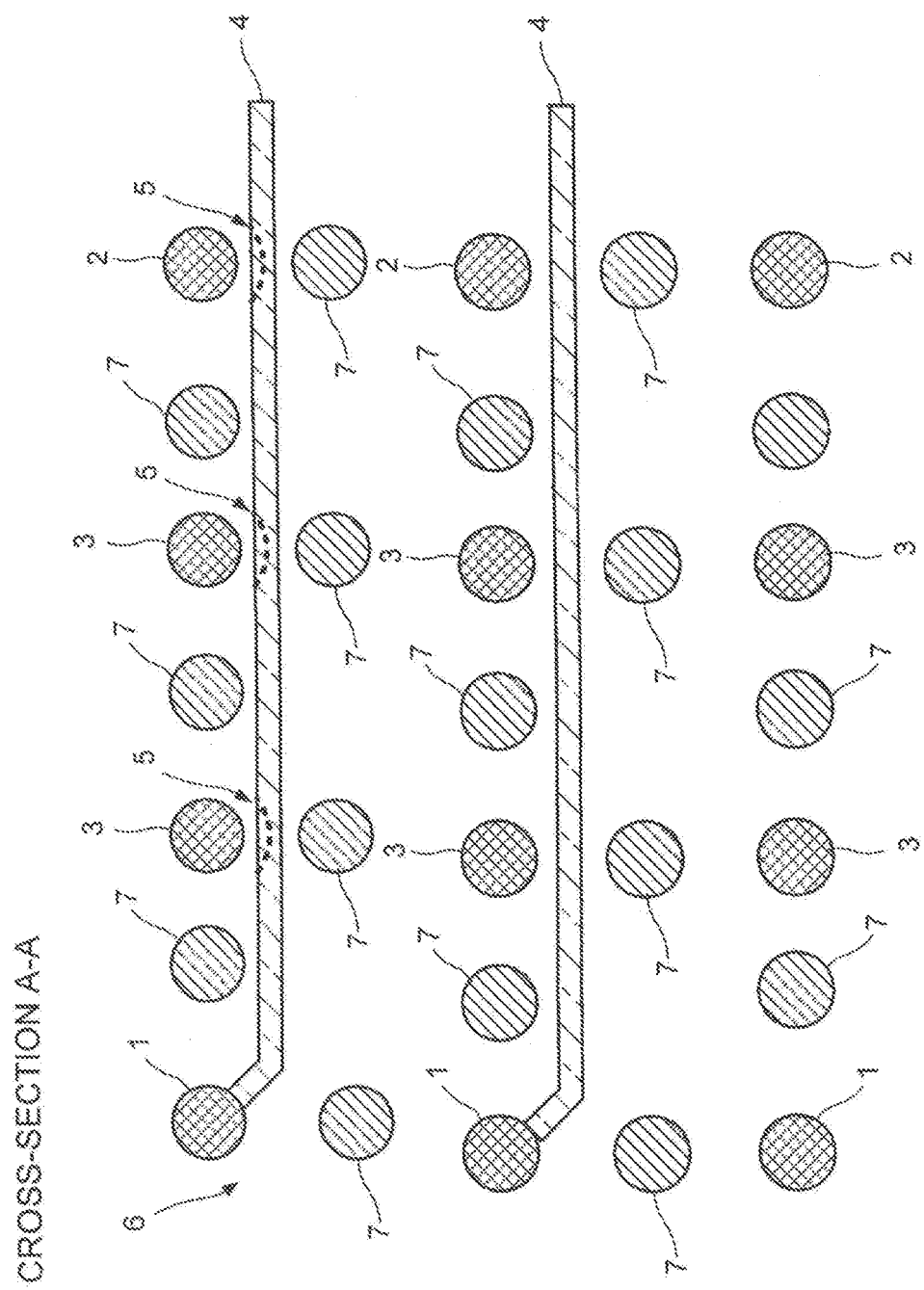
FIG. 3 is a sectional top view showing the breakout of the inner-most via row requiring isolation.

FIG. 3 has the following element numbers:
1. Inner-most Integrated Circuit Device Escape via with controlled depth drill diameter shown.
2. Outer-most Integrated Circuit Device Escape via built into the sub-lamination
3. Inner Integrated Circuit Device Escape via built into the sub-lamination
4. Conductive metal traces (e.g. copper) for escaping the integrated circuit device and connecting it electrically to other devices
5. Outline of the controlled depth drill diameter, showing the potential to penetrate an escape trace [4], if the escape traces are not properly sequenced from inner most row toward the "top" of the sub-lamination stack-up to outer most row escaping from the "bottom" of the sub-lamination stack-up. Top and bottom are relative to the mounting side ("top") of the integrated circuit device. Arrow indicates potential region of drill to trace conflict.
6. Outline of the metal trace on layer [AA]
7. Conductive Isolation barrier, connected to ground planes. The barrier is shown in this drawing as a simple drilled via.

Figure 4:
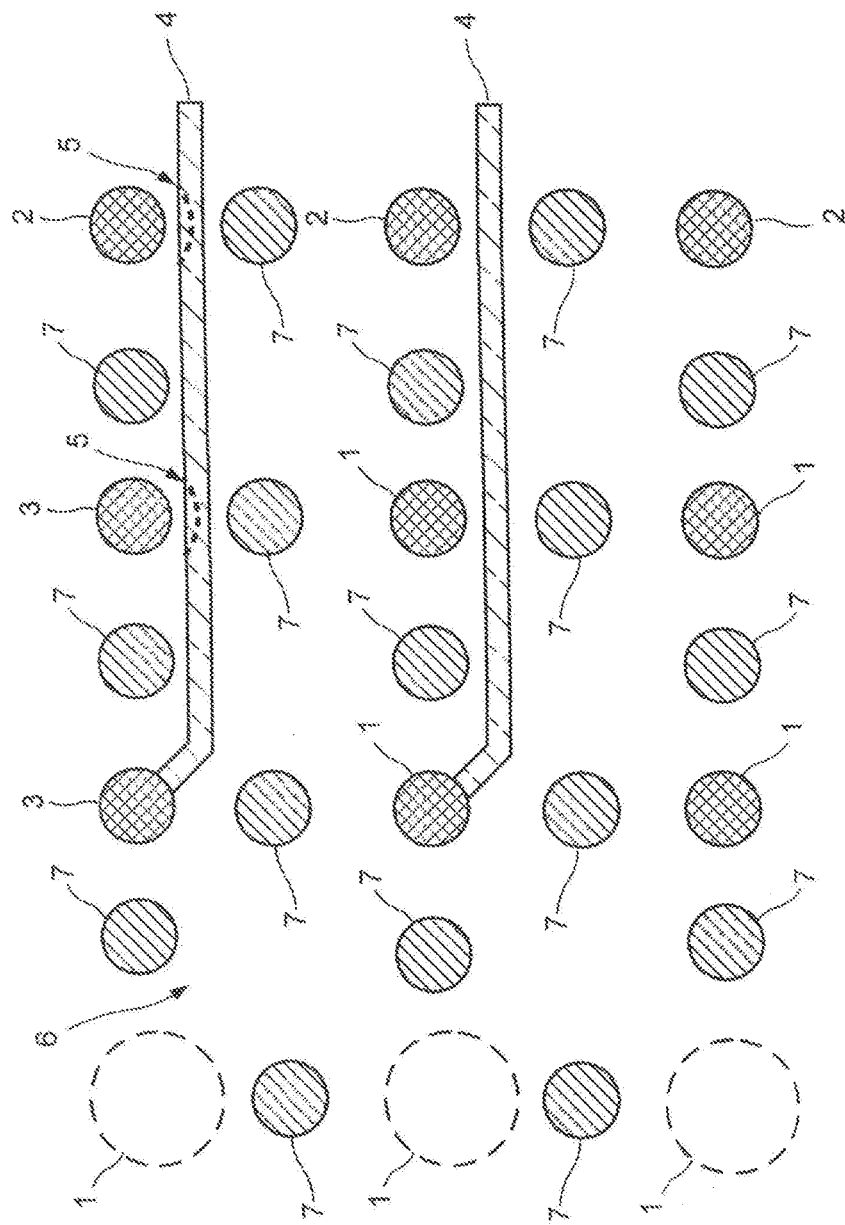

FIG. 4 has the following element numbers:
Cross-section AA: "Top" (closest to integrate circuit device mounting side) escape layer
1. Inner-most Integrated Circuit Device Escape via with controlled depth drill diameter shown.
2. Outer-most Integrated Circuit Device Escape via built into the sub-lamination
3. Inner Integrated Circuit Device Escape via built into the sub-lamination
4. Inner Integrated Circuit Device Escape via with controlled depth drill diameter shown.
5. Conductive metal traces (e.g. copper) for escaping the integrated circuit device and connecting it electrically to other devices
6. Outline of the controlled depth drill diameter, showing the potential to penetrate an escape trace [5], if the escape traces are not properly sequenced from inner most row toward the "top" of the sub-lamination stack-up to outer most row escaping from the "bottom" of the sub-lamination stack-up. Top and bottom are relative to the mounting side ("top") of the integrated circuit device. Arrow indicates potential region of drill to trace conflict.
7, 7A, 7B Conductive Isolation barrier, connected to ground planes. The barrier is shown in this drawing as a simple drilled via.
7. Outline of the metal trace on layer [AA] and [BB].

Figure 5:
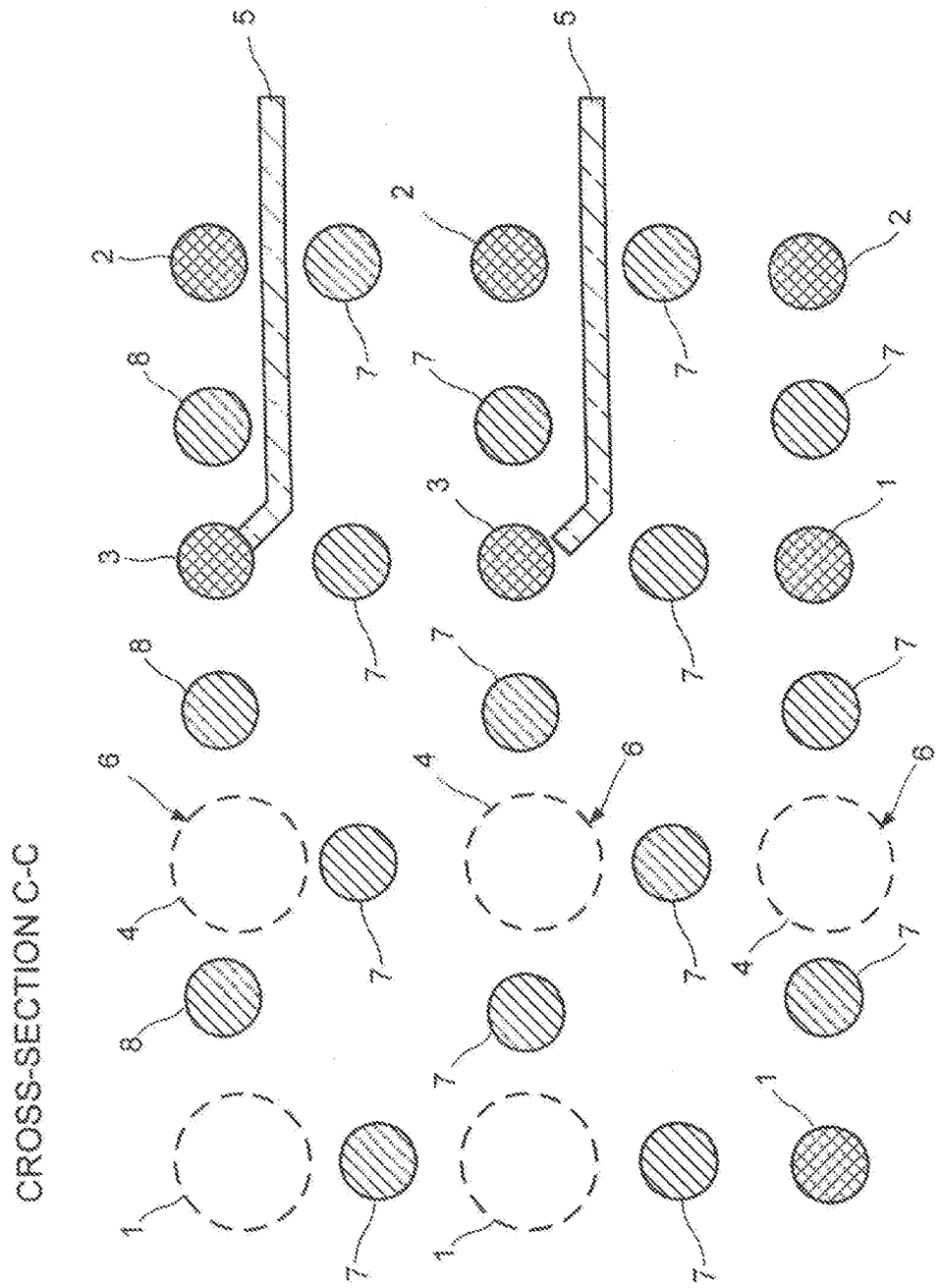

FIG. 5 shows cross-section AA: "Top" (closest to integrate circuit device mounting side) escape layer FIG. 5 has the following element numbers:
1. Inner-most Integrated Circuit Device Escape via with controlled depth drill diameter shown.
2. Outer-most Integrated Circuit Device Escape via built into the sub-lamination
3. Inner Integrated Circuit Device Escape via built into the sub-lamination
4. Inner Integrated Circuit Device Escape via with controlled depth drill diameter shown.
5. Conductive metal traces (e.g. copper) for escaping the integrated circuit device and connecting it electrically to other devices
6. Outline of the controlled depth drill diameter, showing the potential to penetrate an escape trace [5], if the escape traces are not properly sequenced from inner most row toward the "top" of the sub-lamination stack-up to outer most row escaping from the "bottom" of the sub-lamination stack-up. Top and bottom are relative to the mounting side ("top") of the integrated circuit device. Arrow indicates potential region of drill to trace conflict.
7, 7A, 7B Conductive Isolation barrier, connected to ground planes. The barrier is shown in this drawing as a simple drilled via.

Outline of the metal trace on layer [AA] and [BB].

Figure 6:
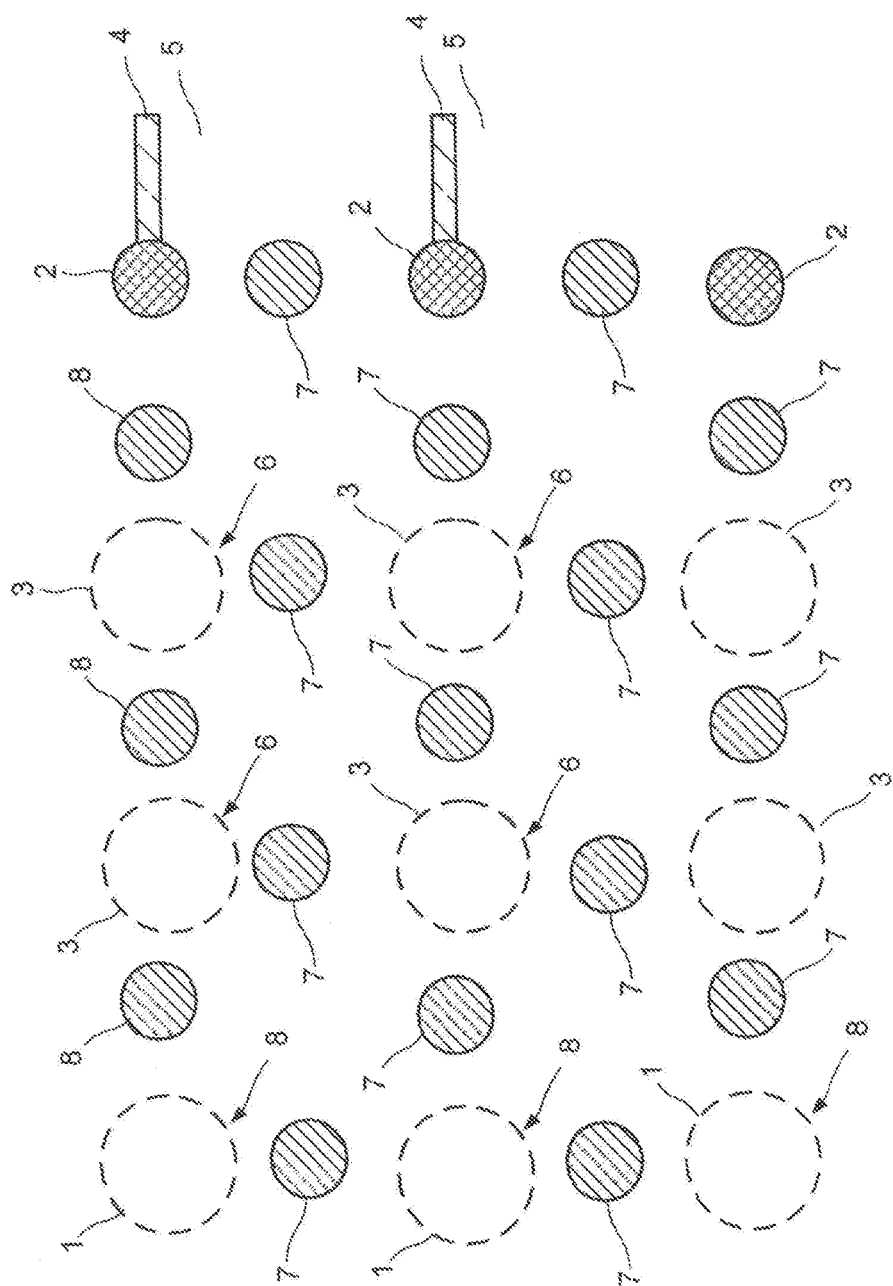
FIG. 6 is a sectional top view of another embodiment of the present invention showing the breakout of the inner-most via row requiring isolation but using an alternative isolation structure to provide for greater isolation

FIG. 6 shows cross-section AA: "Top" (closest to integrate circuit device mounting side) escape layer FIG. 6 has the following element numbers:
1. Inner-most Integrated Circuit Device Escape via with controlled depth drill diameter shown.
2. Outer-most Integrated Circuit Device Escape via built into the sub-lamination
3. Inner Integrated Circuit Device Escape via with controlled depth drill diameter shown.
4. Conductive metal traces (e.g. copper) for escaping the integrated circuit device and connecting it electrically to other devices
5. Outline of the metal trace on layer [AA], [BB], and [CC], showing the potential to penetrate with controlled depth drills [3], if the escape traces are not properly sequenced from inner most row toward the "top" of the sub-lamination stack-up to outer most row escaping from the "bottom" of the sub-lamination stack-up. Top and bottom are relative to the mounting side ("top") of the integrated circuit device. Arrow indicates potential region of drill to trace conflict.
6. Region of potential conflict between controlled depth drill and trace.
7, 7A, or 7B Conductive isolation bather, shown as simple drilled via. inner most region (no conflict).

Figure 7:
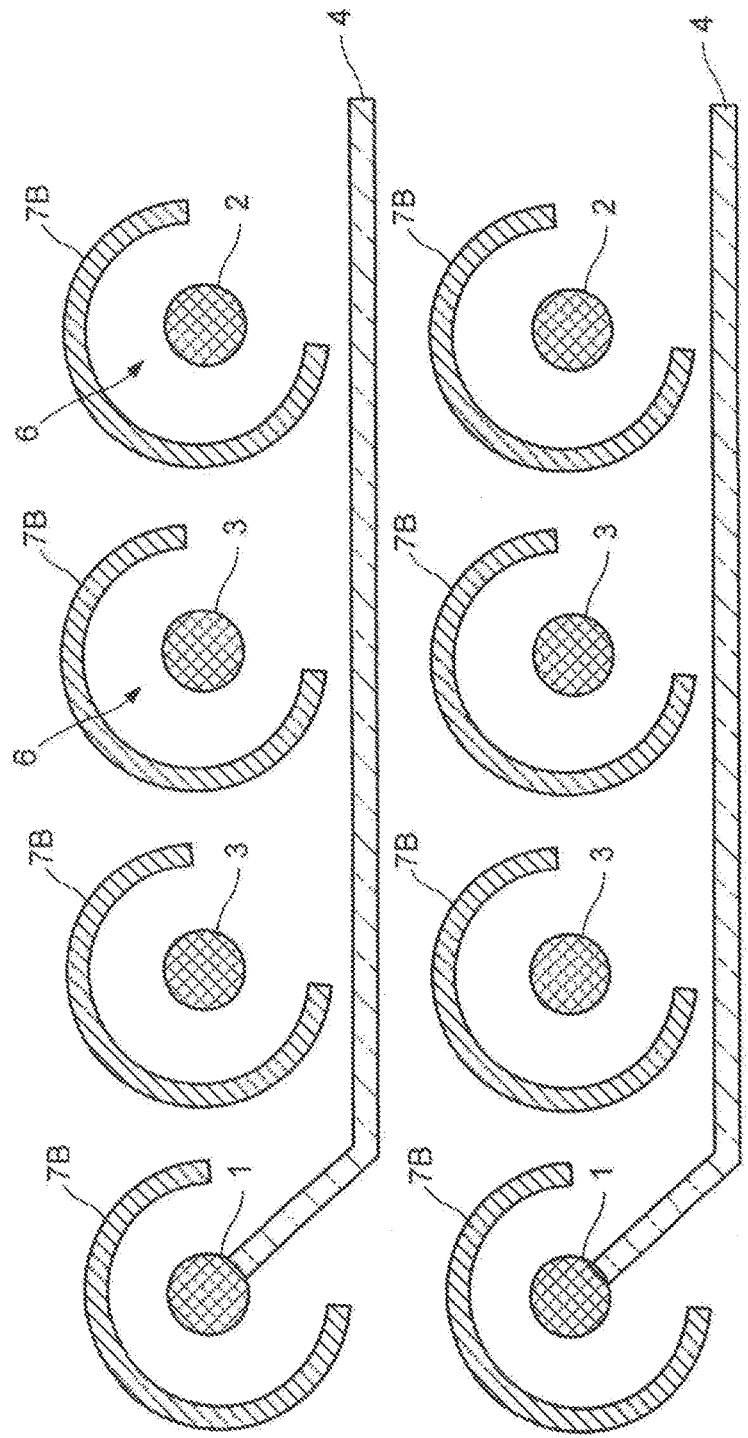
FIG. 7 illustrates another embodiment for the present invention where the isolation barrier is formed as a C-shaped conductive isolation barrier.

FIG. 7 shows a cross-section AA: "Top" (closest to integrate circuit device mounting side) escape layer showing a mechanically routed or laser routed "C" shaped cut, isolation barrier FIG. 7 shows a C-shaped conductive isolation barrier having the following element numbers:
1. Inner-most Integrated Circuit Device Escape via built into the sub-lamination
2. Outer-most Integrated Circuit Device Escape via built into the sub-lamination
3. Inner Integrated Circuit Device Escape via built into the sub-lamination
5. Conductive metal traces (e.g. copper) for escaping the integrated circuit device and connecting it electrically to other devices
6. Outline of the controlled depth drill diameter, showing the potential to penetrate an escape trace [4], if the escape traces are not properly sequenced from inner most row toward the "top" of the sub-lamination stack-up to outer most row escaping from the "bottom" of the sub-lamination stack-up. Top and bottom are relative to the mounting side ("top") of the integrated circuit device. (Only 2 shown) The controlled depth drill may penetrate the "c-shaped" cut.
7B Conductive Isolation barrier, connected to ground planes. "C-Shape" with an opening for the trace escape provides highest level of isolation.

Figure 8:
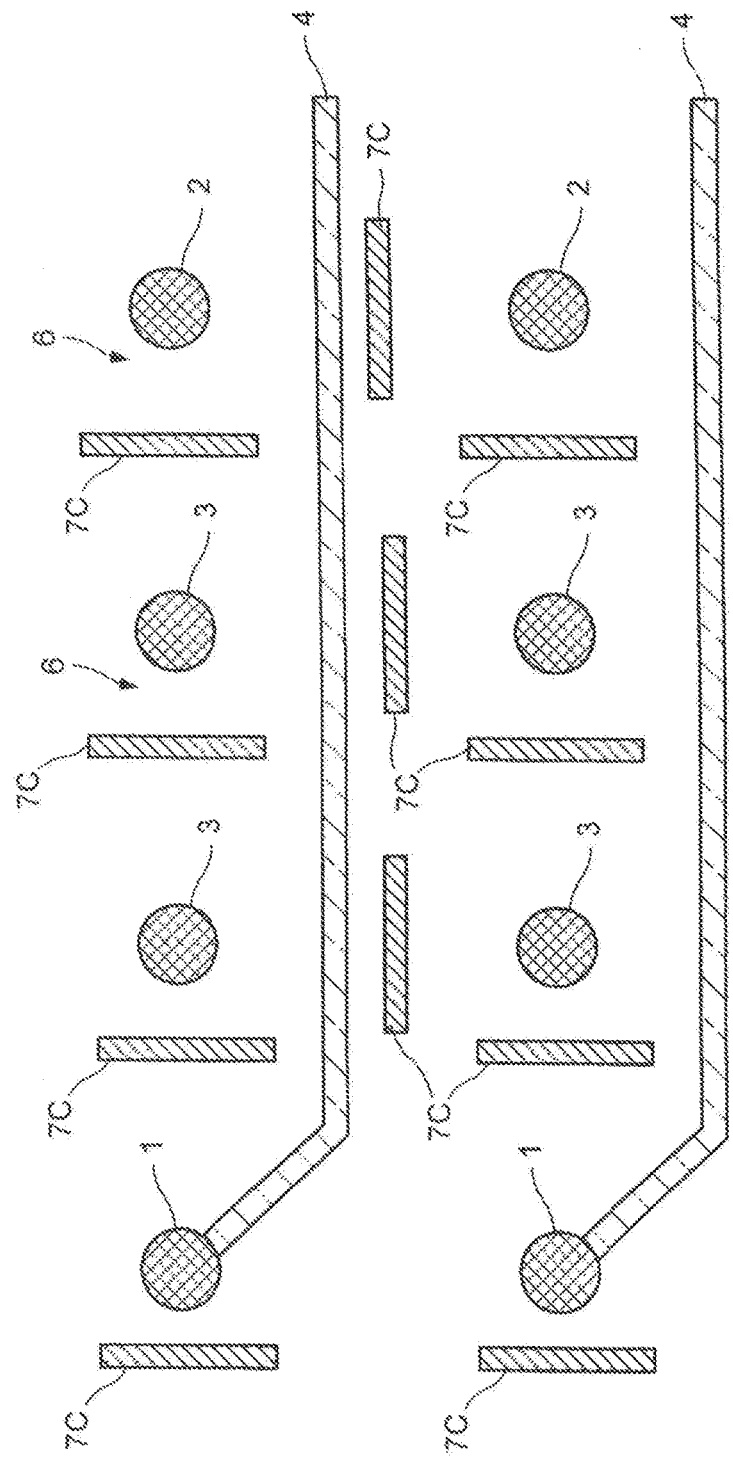
FIG. 8 illustrates another embodiment for the present invention where the isolation barrier is formed as a wall-shaped conductive isolation barrier.

FIG. 8 shows a cross-section AA: "Top" (closest to integrate circuit device mounting side) escape layer showing a mechanically routed or laser routed wall-shaped cut, isolation barrier FIG. 8 illustrates the C shaped conductive isolation barrier of FIG. 8 in a sectional view having the following element numbers:
1. Inner-most Integrated Circuit Device Escape via built into the sub-lamination
2. Outer-most Integrated Circuit Device Escape via built into the sub-lamination
3. Inner Integrated Circuit Device Escape via built into the sub-lamination
4. Conductive metal traces (e.g. copper) for escaping the integrated circuit device and connecting it electrically to other devices
6 Outline of the controlled depth drill diameter, showing the potential to penetrate an escape trace [4], if the escape traces are not properly sequenced from inner most row toward the "top" of the sub-lamination stack-up to outer most row escaping from the "bottom" of the sub-lamination stack-up. Top and bottom are relative to the mounting side ("top") of the integrated circuit device. (Only 2 shown) The controlled depth drill may penetrate the "wall" cut.
7C Conductive Isolation barrier, connected to ground planes. "Wall-shape" with an opening for the trace escape provides better isolation than simple drill.

Figure 14:
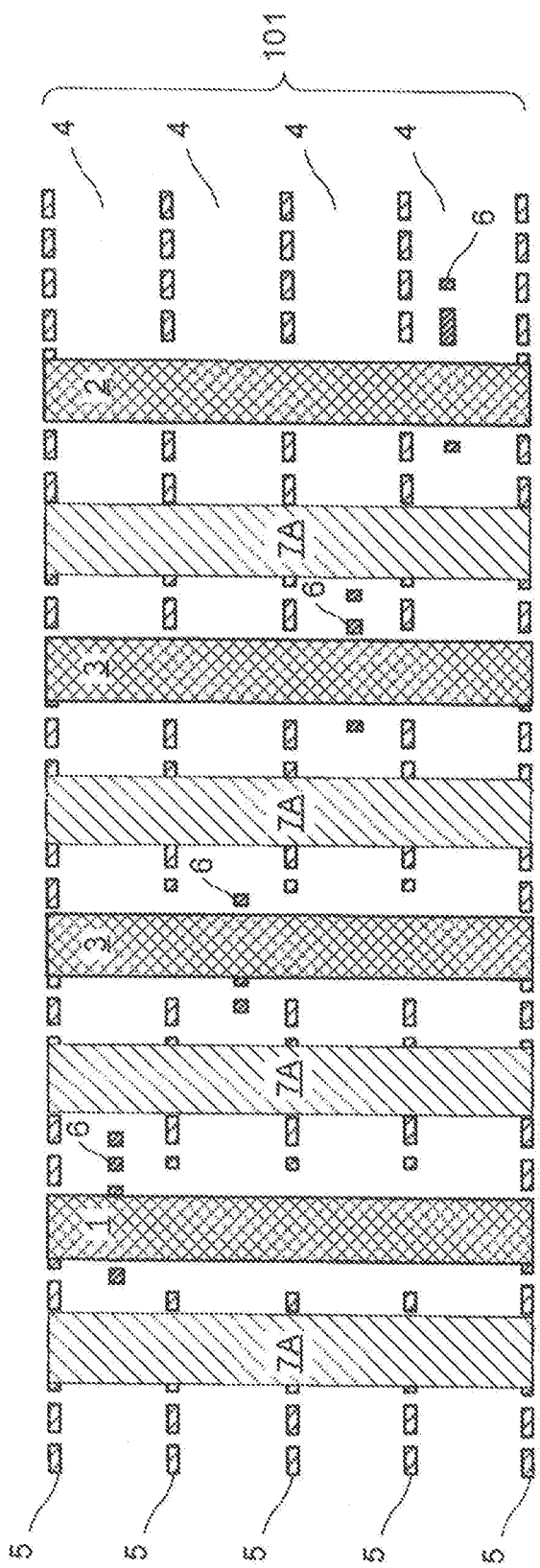

FIGS. 14-17 illustrates the second method of the present invention for structure 1 utilizing a simple copper plate. FIG. 14 shows the first step in the second method creating an isolation barrier in the same steps as the escape vias shown in the first method in FIGS. 9-13.

FIG. 14 has the following element numbers:
1. Inner-most Integrated Circuit Device Escape via built into the sub-lamination
2. Outer-most Integrated Circuit Device Escape via built into the sub-lamination
3. Inner Integrated Circuit Device Escape via built into the sub-lamination
4. Non-conductive dielectric (e.g. printed circuit board) material
5. Conductive metal (e.g. copper) foil in a full plane configuration to provide ground plane coverage for escape traces. Planes are etched openings for clearance of non-ground escape vias.
6. Conductive metal traces (e.g. copper) for escaping the integrated circuit device and connecting it electrically to other devices
7A Conductive Isolation bather electrically connected to ground planes [4]: In Method 2, the conductive isolation barrier is created using the same plating process as the escape vias (electroless plate, followed by electrolytic plate.

Figure 15:
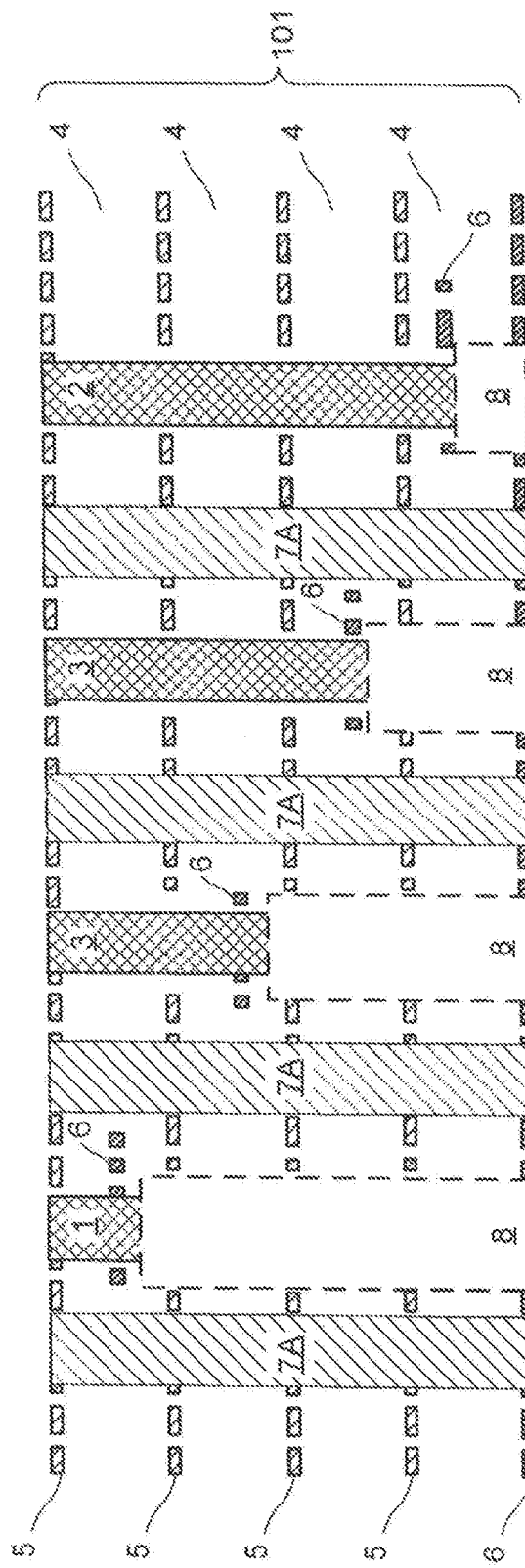

FIG. 15 is step 2 of method 1 of FIG. 14 in which excess metal stubs are removed from escape vias by a controlled depth drill process. FIG. 15 has the following element numbers:
1. Inner-most Integrated Circuit Device Escape via built into the sub-lamination
2. Outer-most Integrated Circuit Device Escape via built into the sub-lamination
3. Inner Integrated Circuit Device Escape via built into the sub-lamination
4. Non-conductive dielectric (e.g. printed circuit board) material
5. Conductive metal (e.g. copper) foil in a full plane configuration to provide ground plane coverage for escape traces. Planes are etched openings for clearance of non-ground escape vias.
6. Conductive metal traces (e.g. copper) for escaping the integrated circuit device and connecting it electrically to other devices
7A Conductive Isolation barrier electrically connected to ground planes [4]:
8. Controlled Depth drill to remove excess via metal (stubs), filled with non-conductive material or vacuum. The CDD must be over-sized to account for manufacturing tolerances, metal wicking, etc. The CDD will damage escape traces if the inner most via/trace does not escape from the top of the sub-lamination stack-up and sequence in a stair-step fashion toward the outer most escape via. As aforementioned the stair-step cross-section shape, when followed, works in conjunction with the escape layer sequence to prevent drill damage to traces.

Figure 16:
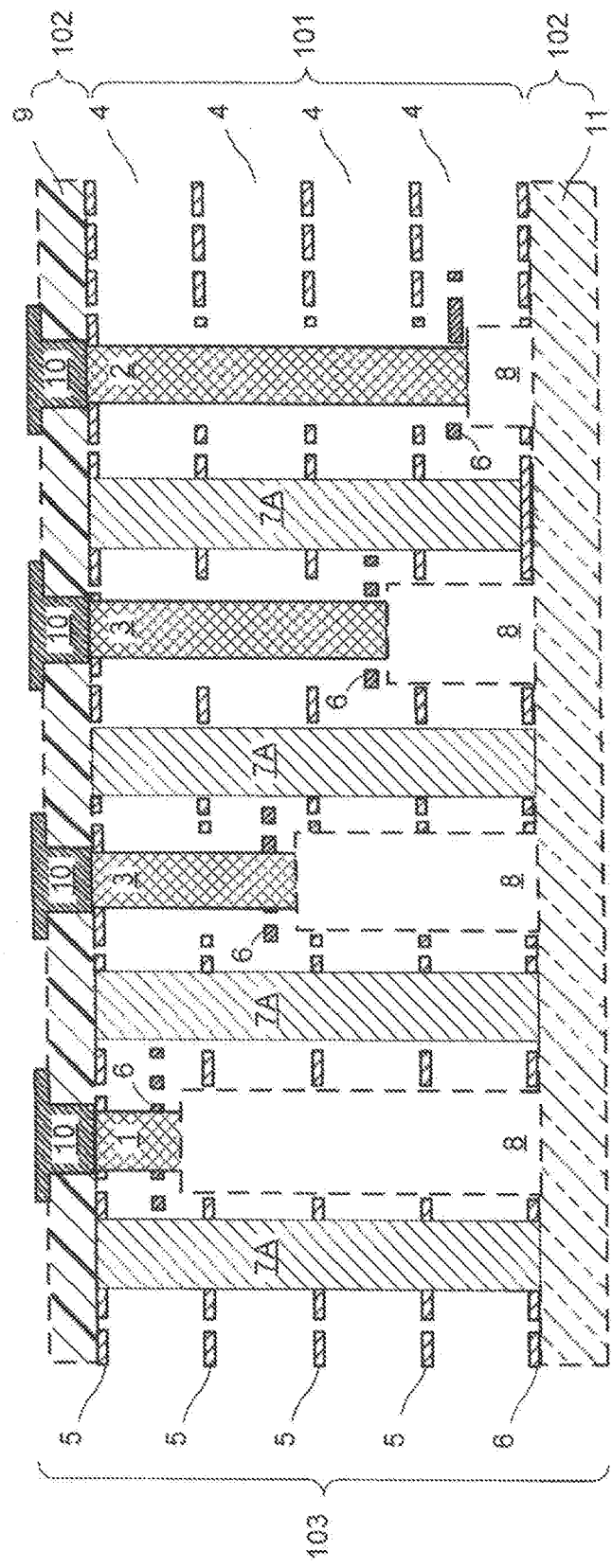

FIG. 16 shows the complete printed circuit board for method 1 of as shown in FIGS. 14 and 15.

Figure 17:
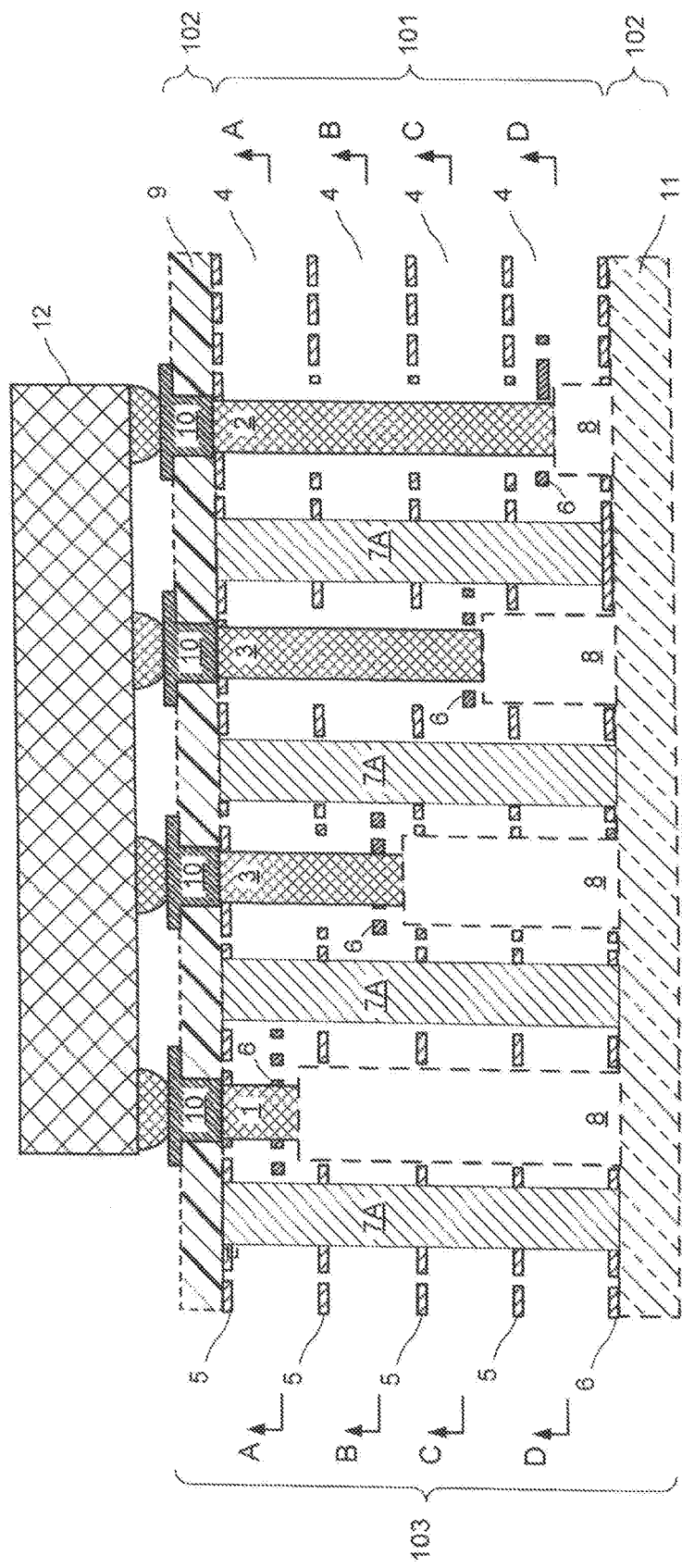
FIG. 17 shows the structure in Mission mode for the embodiment of FIGS. 14-16 of the present invention.

FIG. 16 has the following element numbers:
1. Inner-most Integrated Circuit Device Escape via built into the sub-lamination
2. Outer-most Integrated Circuit Device Escape via built into the sub-lamination
3. Inner Integrated Circuit Device Escape via built into the sub-lamination
4. Non-conductive dielectric (e.g. printed circuit board) material
5. Conductive metal (e.g. copper) foil in a full plane configuration to provide ground plane coverage for escape traces. Planes are etched openings for clearance of non-ground escape vias.
6. Conductive metal traces (e.g. copper) for escaping the integrated circuit device and connecting it electrically to other devices
7A Conductive Isolation barrier electrically connected to ground planes [4]:
8 Controlled Depth drill to remove excess via metal (stubs), filled with non-conductive material or vacuum.
9 Very thin build-up layer of non-conductive dielectric material.
10 Micro-via and external connecting escape vias to the surface for integrated circuit device or socket attachment
11 (Optional) lower portion/bulk of the printed circuit board or attaching structure FIG. 17 shows the structure in mission mode for this embodiment of FIGS. 14-16. FIG. 17 has the following element numbers:
1. Inner-most Integrated Circuit Device Escape via built into the sub-lamination
2. Outer-most Integrated Circuit Device Escape via built into the sub-lamination
3. Inner Integrated Circuit Device Escape via built into the sub-lamination
4. Non-conductive dielectric (e.g. printed circuit board) material
5. Conductive metal (e.g. copper) foil in a full plane configuration to provide ground plane coverage for escape traces. Planes are etched openings for clearance of non-ground escape vias.
6. Conductive metal traces (e.g. copper) for escaping the integrated circuit device and connecting it electrically to other devices
7A Conductive Isolation barrier electrically connected to ground planes [4]:
8 Controlled Depth drill to remove excess via metal (stubs), filled with non-conductive material or vacuum.
9 Very thin build-up layer of non-conductive dielectric material.
10 Micro-via and external connecting escape vias to the surface for integrated circuit device or socket attachment
11 (Optional) lower portion/bulk of the printed circuit board or attaching structure.
12 Integrated Circuit device: solder reflow attached or socketed. This attach mechanism is peripheral to the patent.

FIGS. 18-22 illustrate a third method for the present invention.

Figure 18:
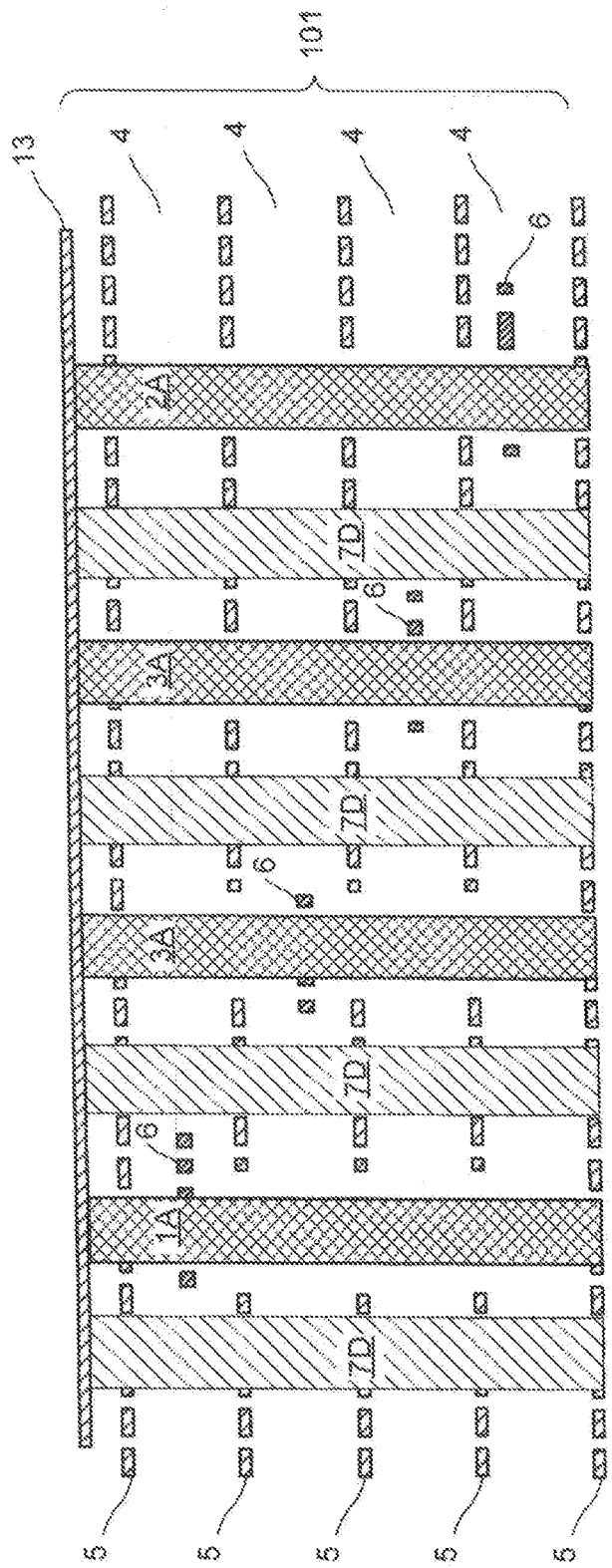

FIG. 18 shows method three, first step in which a conductive isolation barrier is created in the same process steps as was the escape vias of the embodiment in FIGS. 9-13. FIG. 18 has the following element numbers:
1A Inner-most Integrated Circuit Device Escape via built into the sub-lamination
2A Outer-most Integrated Circuit Device Escape via built into the sub-lamination
3A Inner Integrated Circuit Device Escape via built into the sub-lamination
4. Non-conductive dielectric (e.g. printed circuit board) material
5. Conductive metal (e.g. copper) foil in a full plane configuration to provide ground plane coverage for escape traces. Planes are etched openings for clearance of non-ground escape vias.
6. Conductive metal traces (e.g. copper) for escaping the integrated circuit device and connecting it electrically to other devices
7D Conductive Isolation bather electrically connected to ground planes [4]: In Method 2, the conductive isolation barrier is created using the same plating process as the escape vias (electroless plate, followed by electrolytic plate.
13. Top metal foil for forming pads on the top surface. Foil is selectively removed to form pads.

Figure 19:
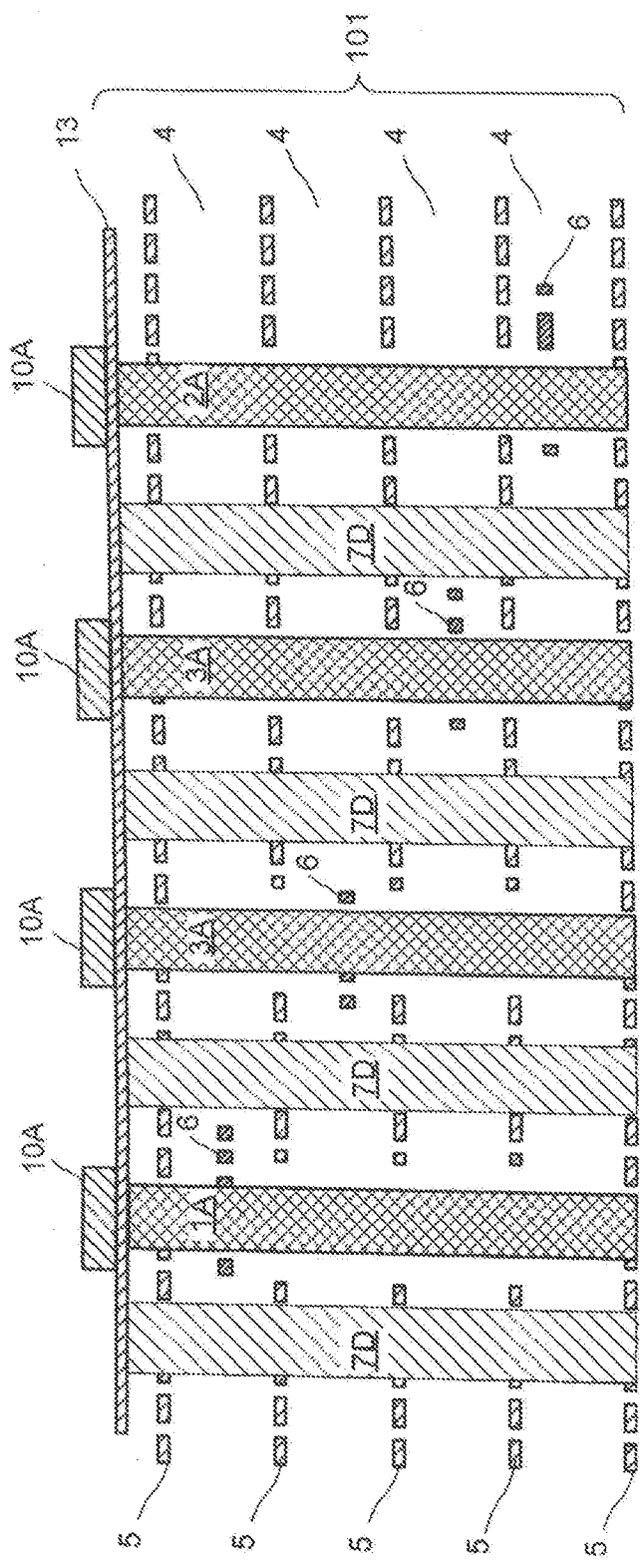
Figure 20:
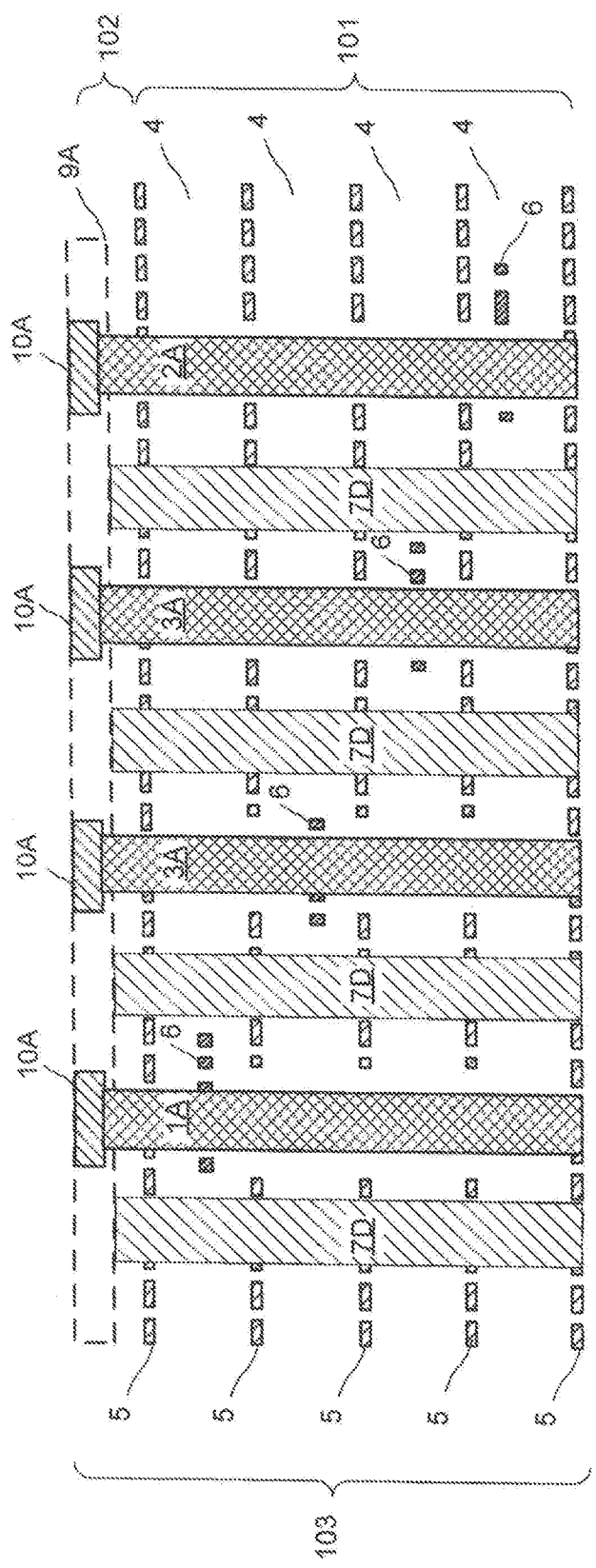

FIG. 19 is the second step of method 3 showing the selective plating of the escape vias. FIG. 19 has the following element numbers:
1A Inner-most Integrated Circuit Device Escape via built into the sub-lamination
2A Outer-most Integrated Circuit Device Escape via built into the sub-lamination
3A Inner Integrated Circuit Device Escape via built into the sub-lamination 1. Non-conductive dielectric (e.g. printed circuit board) material
2. Conductive metal (e.g. copper) foil in a full plane configuration to provide ground plane coverage for escape traces. Planes are etched openings for clearance of non-ground escape vias.
3. Conductive metal traces (e.g. copper) for escaping the integrated circuit device and connecting it electrically to other devices
7D Conductive Isolation bather electrically connected to ground planes [4]: In Method 2, the conductive isolation barrier is created using the same plating process as the escape vias (electroless plate, followed by electrolytic plate.
10A Pad for escape via with finish plating.
13 Top metal foil for forming pads on the surface FIG. 20 illustrates step 3 of method 3 of the present invention in which there is an etching of the top metal, finish plate, and the void is filled with a liquid dielectric referred to as a "flush circuit". FIG. 20 has the following element numbers:

1A Inner-most Integrated Circuit Device Escape via built into the sub-lamination
2A Outer-most Integrated Circuit Device Escape via built into the sub-lamination
3A Inner Integrated Circuit Device Escape via built into the sub-lamination
4. Non-conductive dielectric (e.g. printed circuit board) material
5. Conductive metal (e.g. copper) foil in a full plane configuration to provide ground plane coverage for escape traces. Planes are etched openings for clearance of non-ground escape vias.
6. Conductive metal traces (e.g. copper) for escaping the integrated circuit device and connecting it electrically to other devices
7D Conductive Isolation barrier electrically connected to ground planes [4]: In Method 2, the conductive isolation barrier is created using the same plating process as the escape vias (electroless plate, followed by electrolytic plate.
[9A Liquid fill dielectric material.
10A Pad for escape via with finish plating.

FIG. 21 illustrates step of method 3 of the present invention showing control depth drill escape vias and removal of excess metal. FIG. 21 has the following element numbers:

1A Inner—most Integrated Circuit Device Escape via built into sub-lamination.
2A Outer-most Integrated Circuit Device Escape via built into the sub-lamination
3A Inner Integrated Circuit Device Escape via built into the sub-lamination
4. Non-conductive dielectric (e.g. printed circuit board) material
5. Conductive metal (e.g. copper) foil in a full plane configuration to provide ground plane coverage for escape traces. Planes are etched openings for clearance of non-ground escape vias.
6. Conductive metal traces (e.g. copper) for escaping the integrated circuit device and connecting it electrically to other devices
7D Conductive Isolation barrier electrically connected to ground planes [4]: In Method 2, the conductive isolation barrier is created using the same plating process as the escape vias (electroless plate, followed by electrolytic plate.
8. Controlled depth drill
9A Liquid fill dielectric material.
10A Pad for escape via with finish plating.

Figure 22:
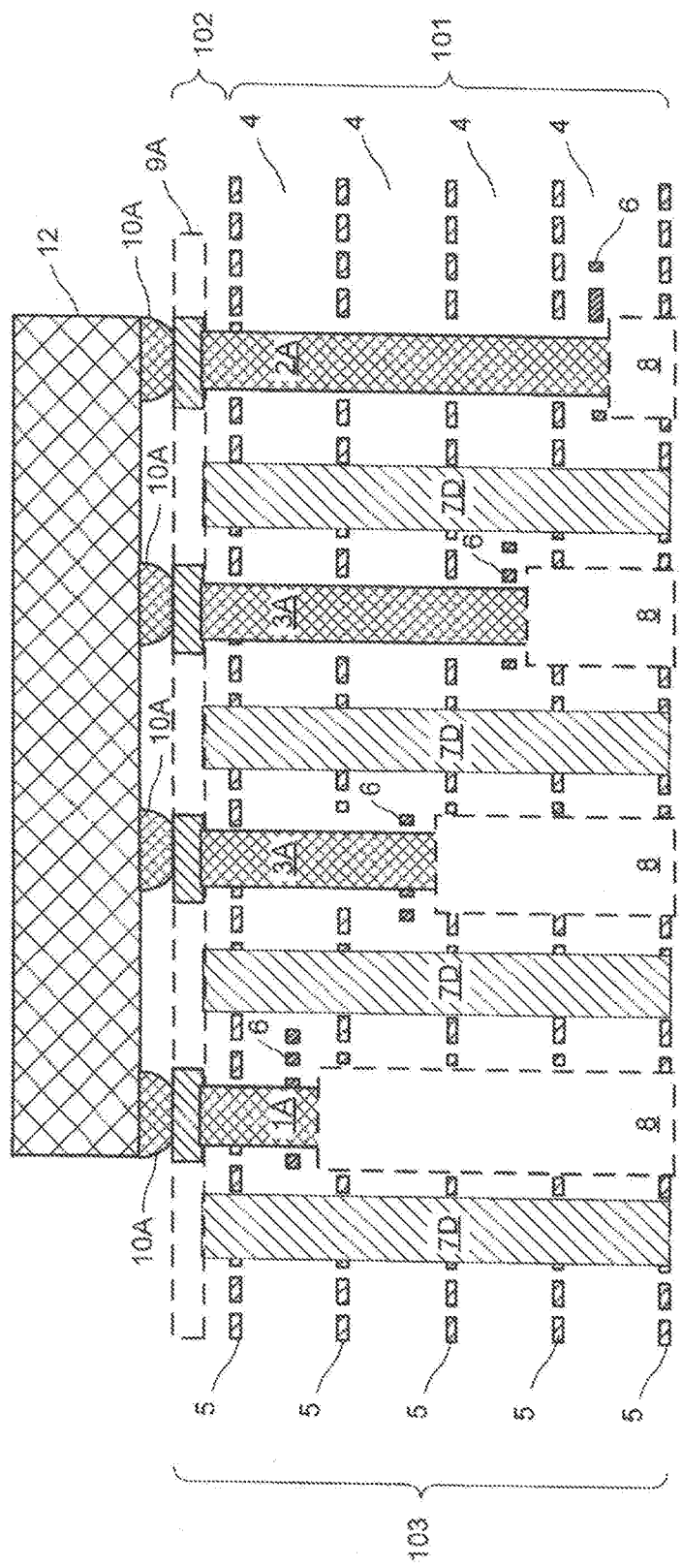

FIG. 22 illustrates Structure 2 in mission mode for method 3 of the present invention.
FIG. 22 has the following element numbers:

1A Inner-most Integrated Circuit Device Escape via built into the sub-lamination
2A Outer-most Integrated Circuit Device Escape via built into the sub-lamination
3A Inner Integrated Circuit Device Escape via built into the sub-lamination
4. Non-conductive dielectric (e.g. printed circuit board) material
5. Conductive metal (e.g. copper) foil in a full plane configuration to provide ground plane coverage for escape traces. Planes are etched openings for clearance of non-ground escape vias.
6. Conductive metal traces (e.g. copper) for escaping the integrated circuit device and connecting it electrically to other devices
7D Conductive Isolation barrier electrically connected to ground planes [4]: In Method 2, the conductive isolation barrier is created using the same plating process as the escape vias (electroless plate, followed by electrolytic plate.
8. Controlled depth drill
9A Liquid fill dielectric material.
10A Pad for escape via with finish plating.
12. Integrated Circuit Device The present invention described In FIGS. 1-22 provides for an improved isolation structure for high speed channels that improves isolation and reduces crosstalk through three methods, several barrier shapes including round hole, c-shape and straight line wall structures and two primary structures. The first primary structure uses a buildup layer and process that includes micro-drilled vias for insulating the isolation barrier from the integrated device. The second primary structure employs a flush dielectric, liquid dielectric fill process for insulating the isolation barrier from the integrated circuit (IC) device. This second primary structure, structure 2, does not use a micro-via process. Instead multiple benefits are provided over structure 1 but at a higher processing cost. These benefits are:

1. The isolation barrier is closer to the solder balls or socket pins of the IC device. This provides for greater isolation.
2. The signal vias are straight walled vias with no jogs. Thus the vias have better signal integrity.
3. The present invention provides three build methods. Methods 1 and 2 go with primary structure 1. These describe how to fill and plate the isolation barrier. Method 3 goes with primary structure 2.

Figure 9:
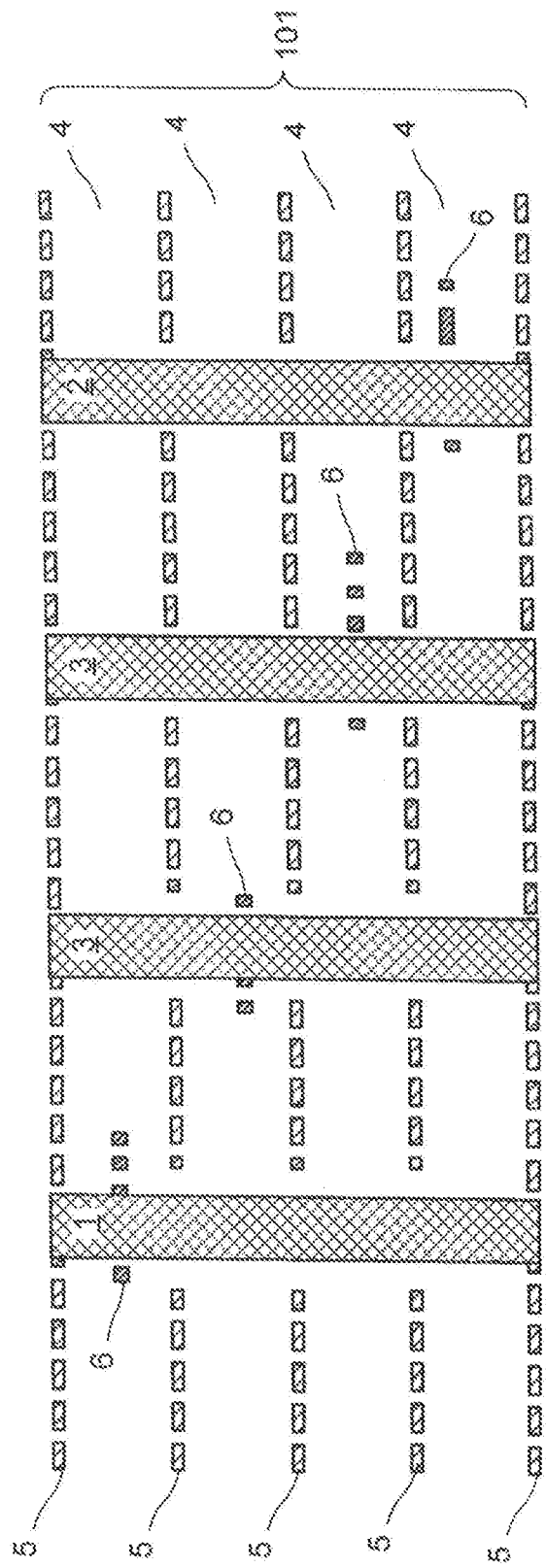
Figure 10:
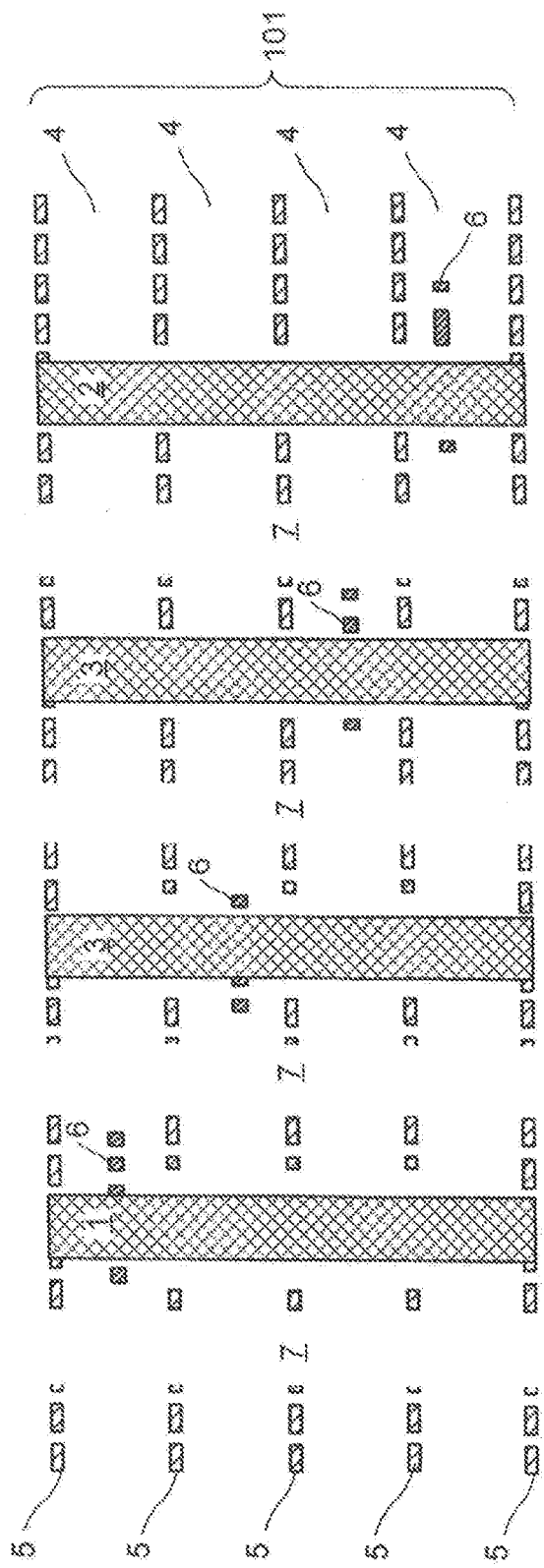

The first method as illustrated in FIGS. 9-13 requires placing an electrically conductive barrier 7 between two or more escape vias 1, 2 of which isolation is a concern. FIG. 10 shows an isolation structure 7 (see next step creating the isolation barrier in FIG. 12) of the present invention with the escape vias 1, 2 connecting to the integrated circuit. FIG. 10 shows the isolation structure of the present invention showing the isolation barrier 7 separating the escape vias 1, 2. The electrically conductive barrier 7 of the present invention connects to ground or the supply of the integrated circuit. This provides a shunt path for electro-magnetic energy associated with the electrically encoded unique information signal coming from or going to each pin of the integrated circuit. The location, size, and shape of the isolation barrier 7 determine the level of isolation. The isolation barrier can be created by two alternative methods either by creating a cavity by mechanical drilling or alternatively laser drilling a simple round barrier 7 (a drilled and plated via as shown in FIGS. 6-9) reduces crosstalk by a factor of approximately 10, which is often acceptable for digitally encoded signals.

Figure 11:
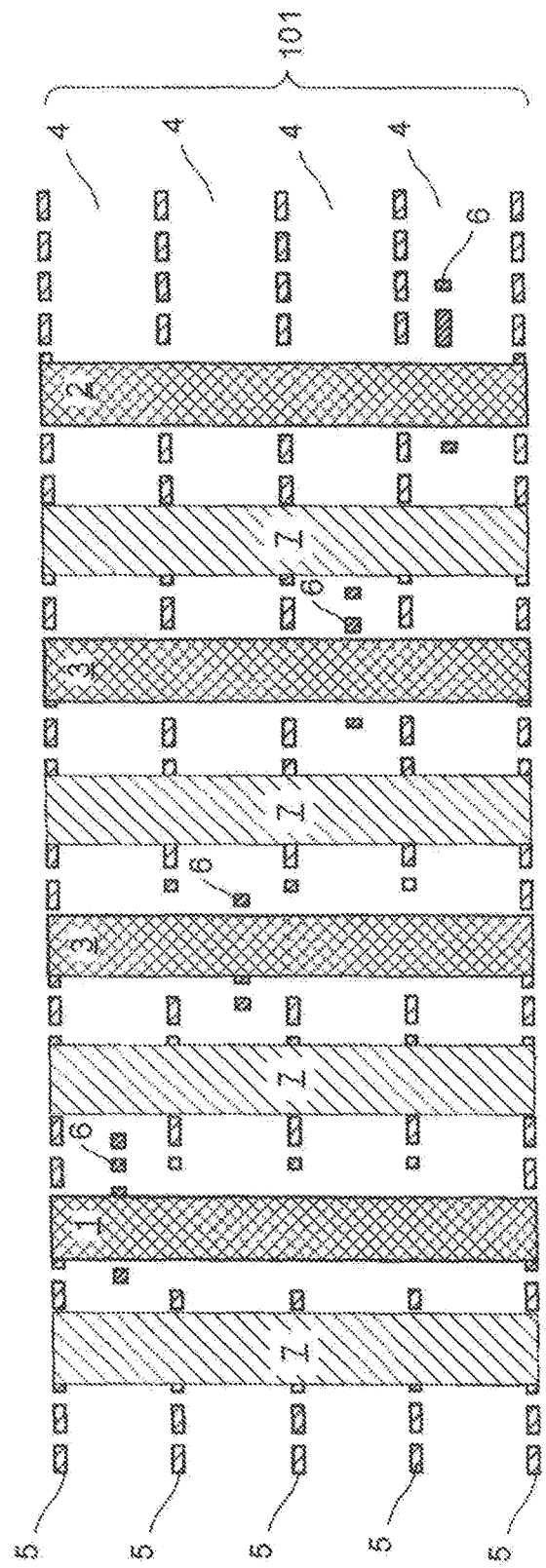
Figure 12:
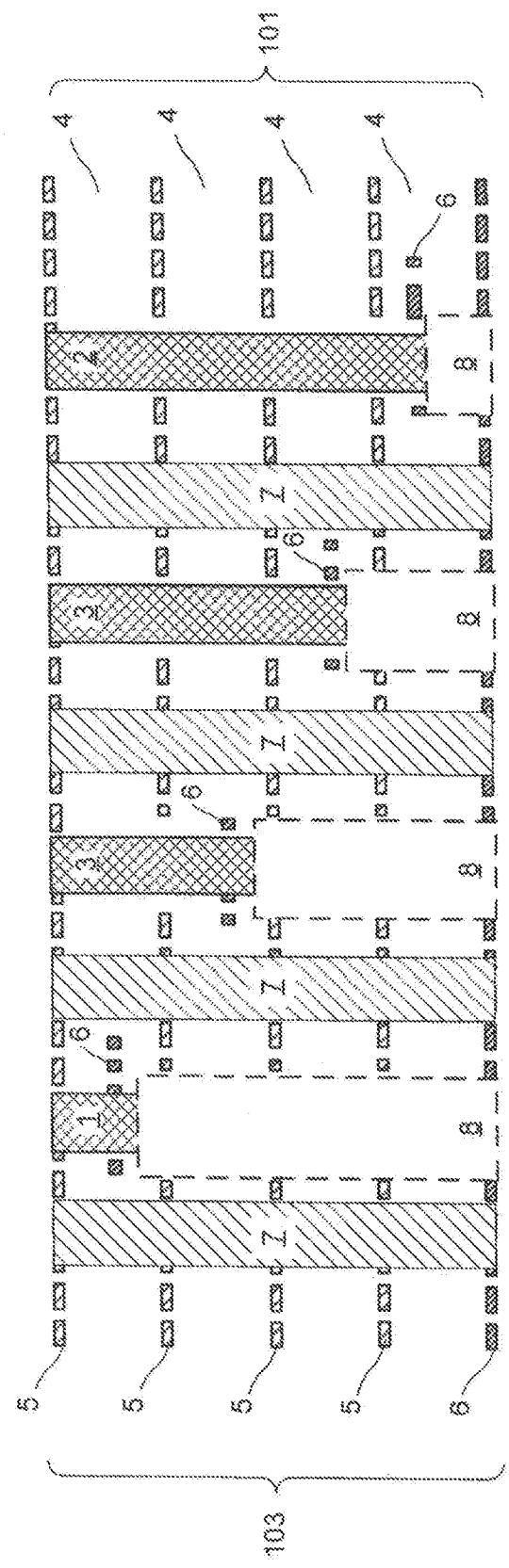
Figure 13:
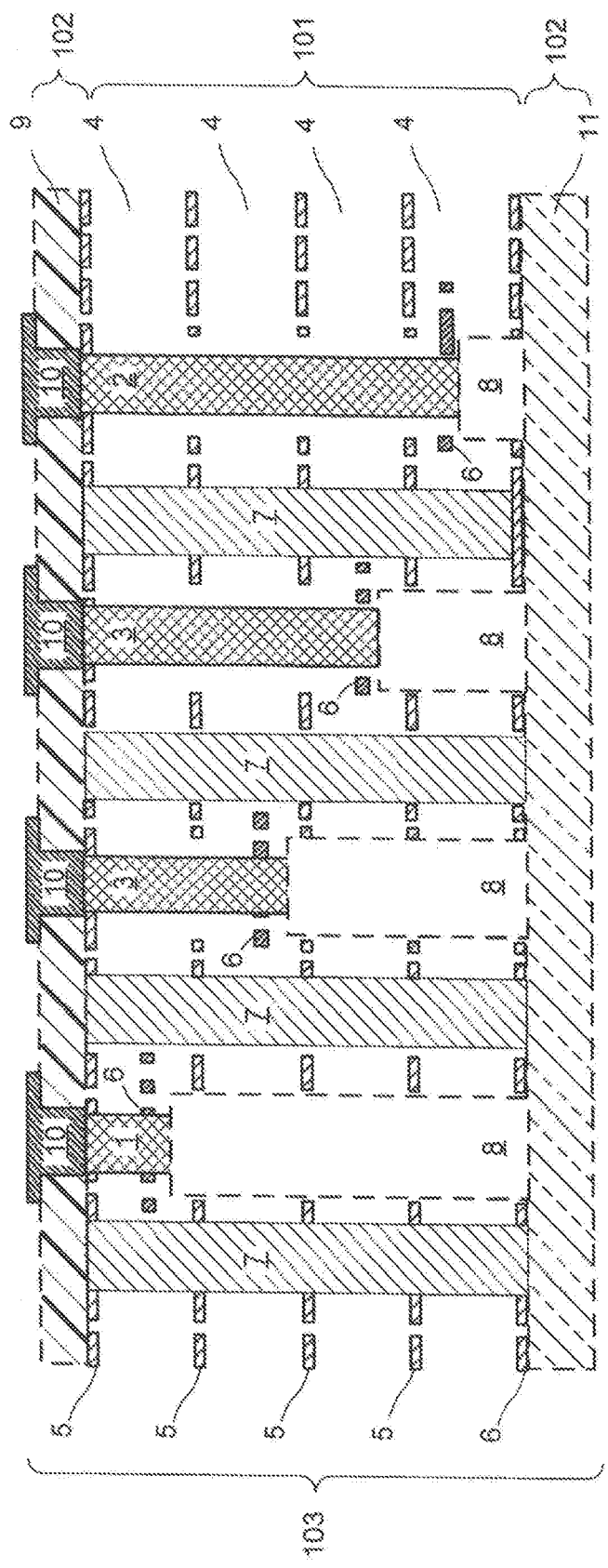

FIG. 11 illustrates an alternative embodiment for creating the isolation barrier for FIG. 9 of the present invention wherein instead of metal plated vias forming the isolation barriers, cavities are created with electroless copper plate and pressed in conductive sintering paste mixed with nickel micro-particles, ultra-thin electroless pale followed by electrolytic nickel plating. FIG. 12 shows an additional step for the embodiment in FIG. 11 wherein excess metal is removed from the escape vias.

FIG. 14 illustrates a more complex, micro-machined cut barrier 7 that reduces crosstalk by a factor of approximately 100-500, which may be required for analog encoding or an RF receiver. The escape trace may be narrower to avoid accidental electrical contact with the isolation barriers. The pin-out of the integrated circuit does not provide for any connections to the isolation barrier 7a directly, therefore it is very important that a non-conductive layer separate the isolation barrier and the integrated circuit pins. The height of this non-conductive layer 6 must be kept as short as possible to maintain good isolation. In the embodiment of FIG. 14 of the present invention a cross-sectional top-down (or layer) view illustrates the breakout of the inner-most via row requiring isolation but uses an alternative isolation structure, providing greater isolation.

Electrically conductive isolation barrier 7a that may be formed of a variety of shapes and sizes such as wall of different shapes or sizes as required by the application and need for isolation. The simplest barrier or passage way 7a is round (drilled and plated via), while the most effective isolation barrier 7a is a micro-machined and plated "C" cut. However the present invention is not limited to any particular size or configuration and other sized or shaped wall structures can be utilized.

The second method of the present invention for reducing crosstalk reduces the coupling length of the escape vias 1, 2 by removing electrically conductive metal in the via wall to a controlled depth through the use of a larger drill, penetrating the printed circuit board or printed circuit board sub-lamination from the opposite side of the integrated circuit (see FIG. 15). The larger drill creates a trace escape concern if done randomly because the larger drill will pass too close to escaping signal traces in the isolation region. Therefore the via trace escape must exactly follow a sequence, whereby the longest controlled depth drill (and thus the shortest escape via) must occur on the inner most vias requiring isolation. This sequence preserves ground plane and required drill hole-to-copper trace spacing needed for the manufacture of the printed circuit board.

The isolation method may be used on a single lamination printed circuit board with one required build-up layer or it may be used in conjunction with multiple sub-laminations. While this structure was developed in an organic material printed circuit board process, it also applies to any multi-layer structure, such as ceramic.

The third method of the present invention is illustrated in FIGS. 18-22 of the drawings. Method 3 of the present invention involves first creating a conductive isolation barrier in the same manner as that of the escape vias for the embodiment of FIGS. 9-13 (FIG. 18). The escape vias 1, 2 are then selectively plated as shown in FIG. 19. and excess metal is removed. The top metal, finish plate is etched and the void is filled with a liquid dielectric referred to as a flush circuit as shown in FIG. 20. The escape vias are control depth drilled and excess metal is removed as shown in FIG. 21. FIG. 22 shows the second structure for method 3 of the present invention in mission mode. Structure 2, method 3 of the present invention uses a different escape mechanism for the vias and insulation method for the isolation barrier. Element numbers 1a, 2a and 3a indicate the different vias and parallel element numbers 1 and 10, 2 and 10 and 3 and 10, respectively, in electrical function. Isolation barrier 7d for structure 2 can mimic the shapes of element numbers 7c and 7b. Element 9a is the dielectric fill and parallels element number 9 in electric function. Element 10a is the connecting pad in structure 2 and parallels element number 10 in electric function. The top foil, element number 13, provides an important process step differing from methods 1 and 2 of the present invention.

While presently preferred embodiments have been described for purposes of the disclosure, numerous changes in the arrangement of method steps and apparatus parts can be made by those skilled in the art. Such changes are encompassed within the spirit of the invention as defined by the appended claims.

What is claimed:

1. A structure for electrically isolating high speed digital signals in a high density grid array, comprising:
an electrically conductive barrier placed substantially parallel to and located in-between and extending substantially along a length of central axes of two or more escape vias in a grid array to obtain isolation; said escape vias being connected to an integrated circuit of said grid array ,said escape vias being built into a sublimation of a laminated printed circuit board of said grid array and extending through said entire pc board; said an electrically conductive barrier being connected to a ground or a supply of said integrated circuit to provide a shunt path for electro-magnetic energy associated with an electrically encoded unique information signal coming from or going toward each pin of said integrated circuit.

2. The structure according to claim 1 wherein said structure for isolating said electrically conductive escape vias from said integrated circuit from one another is formed by an addition of an electrically conductive structure connected to a ground or power reference layer or layers.

3. The structure according to claim 1 wherein said structure is separated from the connecting pins of the integrated circuit by a non-conductive layer.

4. The structure according to claim 1 wherein said structure has a minimal shape for lower cost, such as a drilled and plated via or micro-via and reduces crosstalk by an approximate factor of 10.

5. The structure according to claim wherein said vias are mechanically drilled.

6. The structure according to claim 1 wherein said vias are laser drilled.

7. The structure according to claim 1 wherein said structure is formed of any shape that provides a high level of isolation, such as a surrounding "C" shaped wall and reduces crosstalk by an approximate factor of 100.

8. The structure according to claim 1 wherein said electrically conductive escape vias from the integrated circuit are shortened in length to reduce coupling by a controlled-depth drilling process.

9. The structure according to claim 8 such that the escape via, after controlled depth drilling, follows a stair-step like cross-sectional structure to ensure that escape traces are not damaged by the drilling process, with the highest via "step" at the inner most escape pin of the BGA grid and the lowest via "step" at the outer most escape pin of the BGA grid.

10. The structure according to claim 8 such that the escape via, after controlled depth drilling, follows a stair-step like cross-sectional structure to ensure that escape traces are not damaged by the drilling process, with the highest via "step" at the inner most escape pin of the BGA grid and the lowest via "step" at the outer most escape pin of the BGA grid.

11. The structure according to claim 8 such that the escape via, after controlled depth drilling, follows a stair-step like cross-sectional structure to ensure that escape traces are not damaged by the drilling process, with the highest via "step" at the inner most escape pin of the BGA grid and the lowest via "step" at the outer most escape pin of the BGA grid.

12. The structure according to claim 1 wherein electrically conductive traces permit signal paths to escape from a tight grid created by the isolating barriers and controlled depth drills.

13. The structure according to claim 1 wherein said structure is provided in a printed circuit board process with a laminated main structure and one buildup layer.

14. The structure according to as described in claim 1, said structure being incorporated within a printed circuit board process with multiple laminated booklets and one buildup layer.

15. A structure according to in claim 1 wherein said structure is formed by a multi-layer process.

16. The structure according to claim 11 wherein said process is a ceramic process.

17. The structure according to claim 1 wherein said electrically conductive barrier is placed between and extends along the entire length of said central axes.

18. The structure according to claim 1 wherein said isolation barrier is formed as round hole.

19. The structure according to claim 1 wherein said isolation barrier is formed as straight wall structure.

20. The structure according to claim 8 wherein said electrically conductive escape vias from the integrated circuit escape in a very specific sequence in the sub-lamination (booklet) such that the inner most escape vias escape near the top of the booklet in order to avoid trace damage from the controlled depth drilling process in claim 8.

21. The structure for electrically isolating high speed digital signals in a high density grid array, comprising:

an electrically conductive barrier placed between two or more cavities, said cavities formed with electroless copper plate and pressed in conductive sintering paste mixed with nickel micro-particles, ultra-thin electroless pale followed by electrolytic nickel plating; said plated cavities being connecting to an integrated circuit of said grid array; an electrically conductive barrier connecting to a ground or a supply of said integrated circuit to provide a shunt path for electro-magnetic energy associated with an electrically encoded unique information signal coming from or going toward each pin of said integrated circuit.

* * * * *